United States Patent [19]
Bowles

[11] Patent Number: 5,155,289
[45] Date of Patent: Oct. 13, 1992

[54] HIGH-VOLTAGE SOLID-STATE SWITCHING DEVICES

[75] Inventor: Edward E. Bowles, San Diego, Calif.

[73] Assignee: General Atomics, San Diego, Calif.

[21] Appl. No.: 724,177

[22] Filed: Jul. 1, 1991

[51] Int. Cl.$^5$ ................................................ F41B 6/00
[52] U.S. Cl. ............................................ 89/8; 124/3; 323/222; 323/268
[58] Field of Search .................. 89/8; 124/3; 323/222, 323/268, 271

[56] References Cited

U.S. PATENT DOCUMENTS

| | | | |
|---|---|---|---|
| 4,473,875 | 9/1984 | Parsons et al. | 323/222 |
| 4,642,476 | 2/1987 | Honig | 89/8 |
| 4,932,305 | 6/1990 | Kemeny | 89/8 |

OTHER PUBLICATIONS

Specification Sheet for Thristor CS 2104 (Brown Boveri).
Specification Sheet for IGBT TA9784XDA (Harris Semiconductor).
Specification Sheet for MCT MCTA20P50 (Harris Semiconductor).
Specification Sheet for MegaFET RFH75NO5 (Harris Semiconductor).

*Primary Examiner*—Stephen C. Bentley
*Attorney, Agent, or Firm*—Fitch, Even, Tabin & Flannery

[57] ABSTRACT

High-voltage, solid-state switches that are capable of interrupting current, offer relatively low on-state losses (low forward voltage drop) and provide for high current densities. Low-voltage transistors and silicon-controlled rectifiers are employed to achieve low power losses at high current densities. One embodiment of the present invention relates to a solid-state switch for controlling a source of direct current. The switch includes four switching elements. Each element has a first terminal, a second terminal and a control signal input terminal. The switching elements provide a high resistance to the flow of electrical current in response to a first control signal. A second control signal causes the switching elements to offer a low resistance to the flow of electrical current. The first and second switching elements are connected in series, as are the third and fourth switching elements. The series combination of the first and second switching elements is then connected in parallel with the series combination of the third and fourth switching elements. A second embodiment of the invention includes three switching elements similar to the elements of the first embodiment, but with the first and the second switching elements wired in series, and with the third switching element being connected in parallel with the series combination of the first and second switching elements. The combination of switching elements allow a silicon-controlled rectifier to be used as a turn-off switch.

13 Claims, 9 Drawing Sheets

HIGH-VOLTAGE SOLID-STATE SWITCHING DEVICES

BACKGROUND OF THE INVENTION

The invention relates generally to high-voltage, solid-state switching devices, and more particularly to such switching devices which provide low on-state losses, support high current densities, and have low volume/mass characteristics.

Presently available solid-state switching devices represent a compromise between low losses and desirable volume/mass characteristics. It is possible to design a relatively low-loss switch with existing solid-state devices; however, such a switch will generally be quite large and heavy. On the other hand, a light, compact solid-state switch will generally offer relatively higher losses. Unfortunately, the existing devices are not able to support low volume/mass characteristics and simultaneously provide low on-state losses.

Furthermore, existing devices must be fabricated on the basis of other design tradeoffs. For example, solid-state devices are available which offer either: (1) current interruption capability; or (2) efficient, high-power operation. However, these two design goals have generally remained mutually exclusive. If high-voltage (i.e., greater than 1000 volts), high current density, low forward voltage drop, and efficient operation are desired, a reverse blocking triode thyristor (commonly known as a silicon-controlled rectifier or SCR) can be used. However, where current interruption capability is desired, the use of a less efficient more costly device, such as a transistor, is mandated if solid-state components are to be used. Unfortunately, currently available transistors are not able to operate as efficiently as SCR's at comparable power levels.

One approach to designing high-voltage, high-current switching devices involves the use of multiple devices wired in parallel-series configurations. An array of field-effect transistors (FET's) or insulated gate bipolar transistors (IGBT's) may be employed, resulting in intrinsic current sharing among the devices. However, the voltage drop across the multiple series devices is prohibitive for many practical applications.

A second approach to designing a high voltage switching device employs two silicon-controlled rectifiers (SCR's) and a commutation capacitor. An SCR is a thyristor that can be triggered into conduction in only one direction. Employing two SCR's as switching elements takes advantage of the lower forward voltage drop of the SCR relative to transistor devices. However, once current starts flowing through the SCR, the SCR cannot be turned off until the current flow approaches zero. Thus, a two-state switching configuration is employed to provide for current interruption capabilities. A capacitor is wired in series with a first SCR, and the resulting capacitor-SCR combination is wired in parallel with a second SCR. A voltage source is connected to the capacitor to provide negative bias when it is desired to interrupt the flow of current through the second SCR. This is accomplished by transferring current from the second SCR to the first SCR, a process referred to as "commutation". Unfortunately, the commutation process requires a relatively large capacitor and a relatively hefty power supply. Furthermore, a negative voltage is impressed across the output terminals of the switch during commutation, when the current is being transferred from one SCR to the other. Since the switch may be wired to a power supply, the output terminals of the switch may be used to supply power to a load device. Hence, it may be said that the output terminals feed power rails which supply power to the load. An additional drawback of this approach is that, as a practical matter, it is very difficult to obtain adequate current sharing between the system components. The result being an increased vulnerability to early device failure.

A third approach to designing high voltage switching devices makes use of a relatively new device known as an MCT, or a metal-oxide silicon-controlled thyristor. A group of MCT's may be wired in parallel-series combinations to provide for the sharing of current. However, a relatively large commutation capacitor is required. It is difficult to obtain a reasonable level of current distribution among the various individual MCT devices which together comprise an MCT array. Furthermore, a series combination of MCT's must be used to achieve a high voltage switch. Finally, the MCT is a relatively new device—it is not on the market at the present time insofar as applicant is aware. Although the device has a promising potential for switching applications, at present, more development is required in this area to produce an MCT with a low forward voltage drop.

A fourth approach to designing high-voltage switching devices uses a gate-turn-off thyristor or GTO. GTO devices offer output current switching that can be controlled or turned off by a large current counter-pulse (approximately 30% of the device current) into the device gate. The GTO is wired in parallel with a commutation capacitor which must sustain the full load current during switching. Like the SCR the GTO can be manufactured at high-current and high-voltage ratings but it is less efficient and it requires a large commutation capacitor and a high current gating power supply to turn off.

From the foregoing it is evident that what is needed is a high-voltage, solid-state switch which offers low on-state resistance and low volume/mass characteristics, that is capable of supporting high current densities. The switch should offer current interruption capabilities. Large, bulky commutation capacitors should not be required because the switch may be employed in applications such as aircraft weapons systems, where size and weight are at a premium. If the switch employs a plurality of solid-state devices arranged in an array, current should be distributed fairly evenly among the various devices. Additionally, some applications may require reverse-blocking capability or polarity protection. Ideally, the switch should not impress a negative voltage upon the power rails during commutation because the presence of a negative voltage renders such switching systems unsuited to many practical applications where polarity-sensitive components might be damaged or destroyed.

SUMMARY OF THE INVENTION

The present invention provides improved high-voltage, solid-state switches which are capable of operating at high current densities with relatively low on-state resistance. A combination of low-voltage transistors and high-voltage SCR's are employed in a hybrid configuration that yields a switch that offers low losses, high power density, and efficiency associated with SCR devices. These advantages are combined, furthermore, with a unique circuit topology which overcomes the inherent inability of the SCR to interrupt current. Thus, the advantages of the SCR and the transistor are combined into one novel solid-state switching device.

Advantageously, in the design of the high voltage solid-state switches of the present invention, manufacturer specifications of the solid-state components have been derated to provide a measure of reliability and device longevity. The circuit elements are relatively small and light, which is very desirable for aircraft applications. Furthermore, the circuit topology does not require the use of a large, heavy, expensive commutation capacitor. Further, the commutation process occurs without the imposition of a negative voltage across the power rails, rendering the invention suitable for use in applications where systems producing negative voltage transients would be undesirable.

The high-voltage, high-current solid-state switches of the present invention are suitable for demanding applications in the area of aircraft weapons systems, aircraft power distribution and control systems, and the like. For instance, the solid-state switches are well suited to the unique requirements of controlling the voltage and the current applied to a railgun-type device. Other applications include DC power distribution systems and DC motor control circuits.

One embodiment of the present invention relates to a solid-state switch for controlling a source of direct current. The switch includes four switching elements. Each element has a first terminal, a second terminal and a control signal input terminal. The switching elements provide a high resistance to the flow of electrical current in response to a first control signal input. A second control signal causes the switching elements to offer a low resistance to the flow of electrical current. The first and second switching elements are connected in series, as are the third and fourth switching elements. The series combination of the first and second switching elements is then connected in parallel with the series combination of the third and fourth switching elements.

A second embodiment of the invention includes three switching elements of the first embodiment similar to the elements discussed above. However, only the first and the second switching elements are connected in series. The third element is then connected in parallel with the series combination of the first and second elements.

The various aspects and features of the invention will become more apparent upon consideration of the appended drawings wherein:

DETAILED DESCRIPTION OF THE PREFERRED EMBODIMENTS

Figure 1:
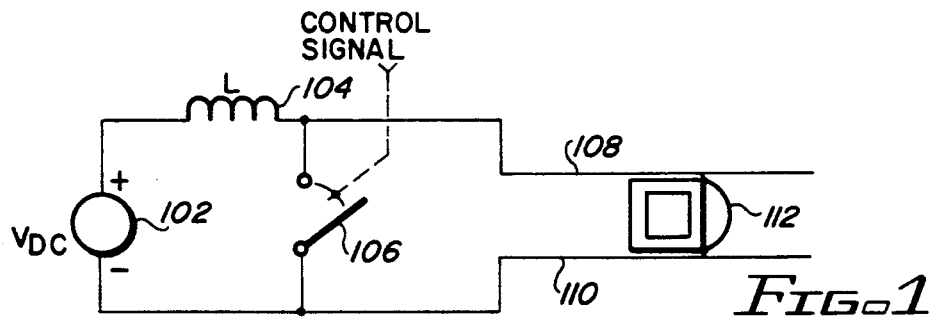
FIG. 1 is a simplified schematic diagram showing a typical railgun power supply system.

The following description is of the best modes presently contemplated for carrying out the invention. This description is not to be taken in a limiting sense, but is made merely for the purpose of describing the general principles of the invention. The scope of the invention should be determined with reference to the claims.

In order to better appreciate and understand the present invention, it will first be helpful to review how the prior art has addressed the needs of a high power solid-state switch. Thus, reference is made to FIG. 1 where there is shown a simplified schematic diagram of a power supply system for a railgun-type device. Voltage source 102 is a high-current DC power supply capable of delivering 250 kilo-amperes of current in the range of 100 to 200 volts. An inductor 104 and a switch 106 are wired in series with the power supply 102 to form a current loop. The switch 106, activated by a control signal, is connected in shunt across two rails, 108 and 110. A railgun projectile 112 is designed to traverse the rails upon receipt of adequate current from the power supply 102/inductor 104 combination. This occurs when the switch 106 is moved from a closed position to an open position after the inductor 104 has charged, thereby effectively removing the shunt across the rails 108, 110. A high voltage of approximately 5000 volts is subsequently produced across the switch from the projectile's acceleration. The theory and operation of railguns is known in the art.

Figure 2A:
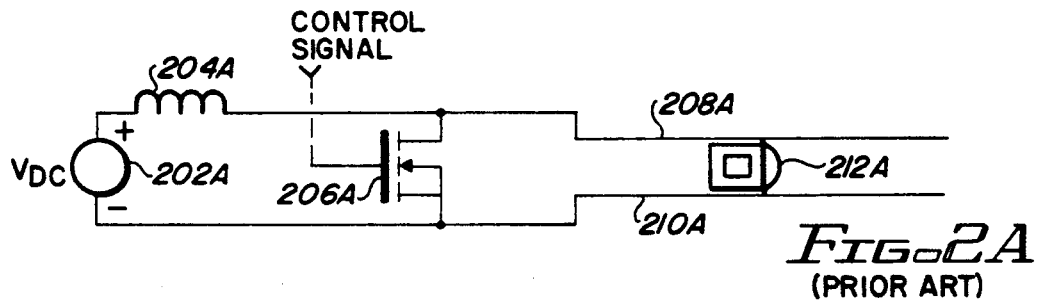
FIGS. 2A and 2B are schematic diagrams showing two prior art solid-state implementations of the switch shown in FIG. 1.
Figure 2B:
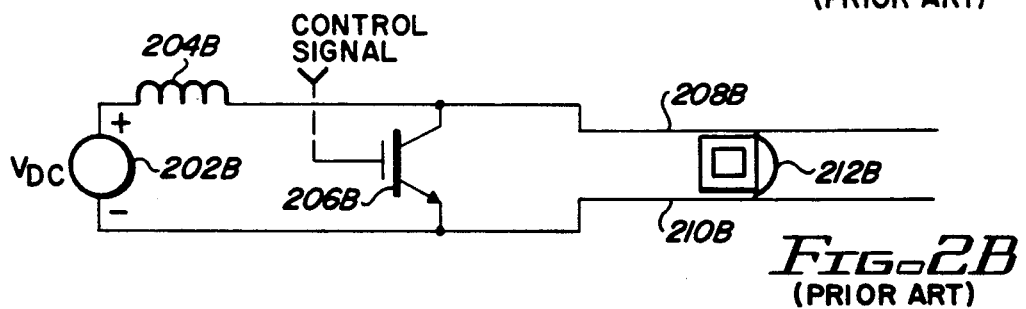

FIGS. 2A and 2B illustrate prior art circuits employing solid-state devices which function in a manner analogous to that of the switch 106 shown in FIG. 1. FIG. 2A uses an array of power field-effect transistors 206A each of which may be rated at 500 volts and 25 amperes. The commutation of current into the rails 208A, 210A is controlled via the gate of field-effect transistor 206A. The FET 206A may consist of an array of discrete FET devices configured in a series parallel arrangement for enhanced current-handling capacity. The FET array provides a degree of intrinsic current sharing. However, the use of multiple series devices to achieve a high voltage rating yields a high on-state voltage drop. Fabricating such an array can be a cost-intensive proposition, and the size of the array may be impractically large in some cases.

FIG. 2B uses an insulated-gate bipolar transistor (IGBT) 206B in place of the field-effect transistor 206A of FIG. 2A. The IGBT is not as costly as its FET counterpart, and IGBT arrays are generally smaller than comparably-rated FET arrays. However, as with the FET circuit, the IGBT arrangement also provides a high on-state voltage drop.

Figure 3A:
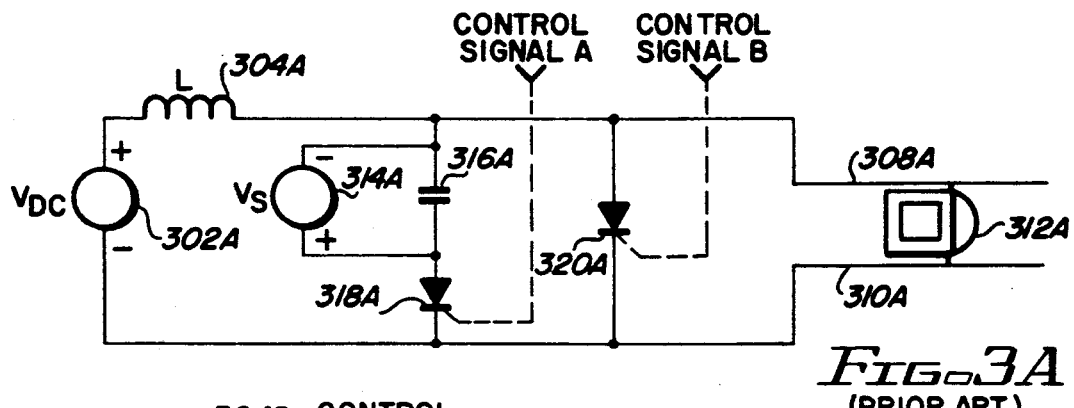
FIGS. 3A and 3B are schematic diagrams showing two additional prior art solid-state implementations of the switch shown in FIG. 1.

FIG. 3A illustrates a prior art switching scheme which overcomes many of the disadvantages of the systems shown in FIGS. 2A and 2B. A high-current power supply 302A, an inductor 304A, and first silicon-controlled rectifier (SCR) 320A are connected in series to form a current loop. A second SCR 318A is connected in series with a commutation capacitor 316A, and the SCR 318A/capacitor 316A combination is wired in shunt across the first SCR 320A. A voltage source $V_s$, 314A, is used to control the voltage across the commutation capacitor 316A. The rails 308A, 310A are connected to respective terminals of SCR 320A as shown in FIG. 3A.

In operation, appropriate control signals must initially be presented to SCR's 318A and 320A such that SCR 320A is conducting and SCR 318A is open. The circuit will remain in this state indefinitely if voltage source 314A is held to zero. At some point in time, it is desired to activate projectile 312A. Such activation is achieved by adjusting voltage source 314A to impress a negative voltage across capacitor 316A, with polarity as shown in FIG. 3A. SCR 318A is then driven into hard conduction, drawing current away from SCR 320A. As the current in SCR 320A drops to zero, the SCR turns off, and SCR 318A carries the full current load. Next, the voltage source 314A across the capacitor 316A is removed. Current is then no longer able to flow through SCR 318A; and the current commutates to the rails 308A, 310A to propel projectile 312A.

Figure 3B:
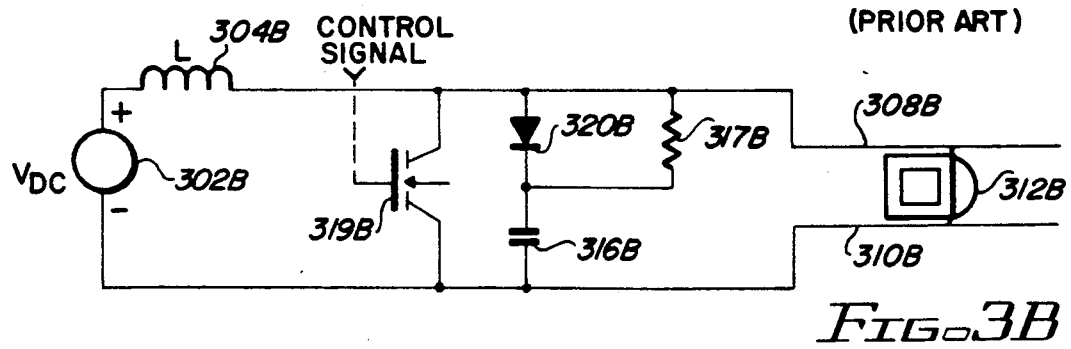

FIG. 3B illustrates the use of a metal-oxide-silicon-controlled thyristor (MCT) 319B to supply power to the railgun apparatus. The MCT is currently in its developmental stages, and is not yet available on the market. The device contains a metal-oxide-silicon (MOS) insulated gate input, and has gate turn-off capability, which provides for the interruption of current flow from collector to emitter. MCT's which are under development provide 500-ampere peak current capability, 40-ampere turn-off capacity, and can block up to 1000 volts.

Figure 4:
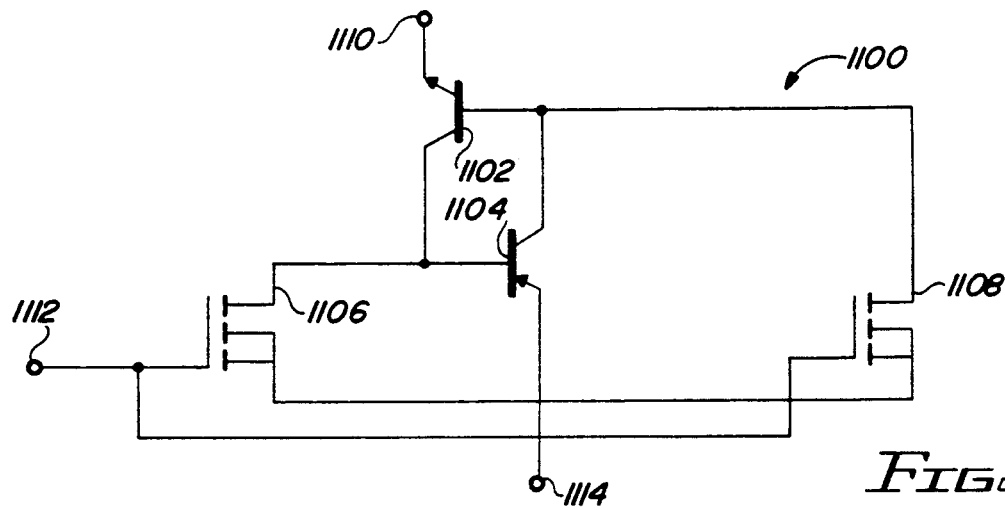
FIG. 4 is a schematic diagram showing a circuit representing the MCT device employed in the circuit of FIG. 3B.

FIG. 4 shows a circuit which emulates the operation of an MCT device 1100. The operation of an MCT device can be closely approximated by connecting two opposite-polarity transistors 1102, 1104 in a bipolar NPNP thyristor configuration. Two opposite-polarity MOSFET transistors 1106, 1108 are used to turn the thyristor on or off as desired. MOSFET 1106 is an N-channel MOSFET, and MOSFET 1108 is a P-channel MOSFET. However, since an MCT is an NPNP device, rather than a PNPN device, the output terminal 1110 (cathode) must be negatively biased with respect to the input terminal 1114 (anode). Driving the gate terminal 1112 negative with respect to the input terminal 1114 turns the P-channel MOSFET 1108 on, firing the bipolar SCR consisting of transistors 1102, 1104. Driving the gate terminal 1112 positive with respect to the input-terminal 1114 turns the N-channel MOSFET 1106 on, shunting the base drive to PNP bipolar transistor 1104, causing the SCR comprised of transistors 1102 and 1104 to turn off. When no gate 1112 to input terminal 1114 potential exists, the input terminals of the bipolar SCR are unterminated. Therefore, the MCT should not be operated without gate bias.

The MCT is a two-state device which may be used in place of any PNP switching device, provided that appropriate input drive signals are supplied. The MCT has a very low impedance at high currents. External current limiting must be applied if short circuits are encountered. The MCT has limited reverse-blocking capability, and its high input impedance simplifies drive circuit requirements.

Unfortunately, practical MCT circuits intended for railgun operation require the use of a relatively large commutation capacitor 316B (FIG. 3B). Furthermore, a critical disadvantage of MCT's is the excessive on-state voltage drop caused by the use of multiple series devices. The collector-to-emitter voltage of a 5000 volt MCT is approximately 5.5 volts with the device turned fully on. If high voltage MCT's could be developed, the MCT would represent a potential candidate for use in railgun-type power supplies.

Figure 5A:
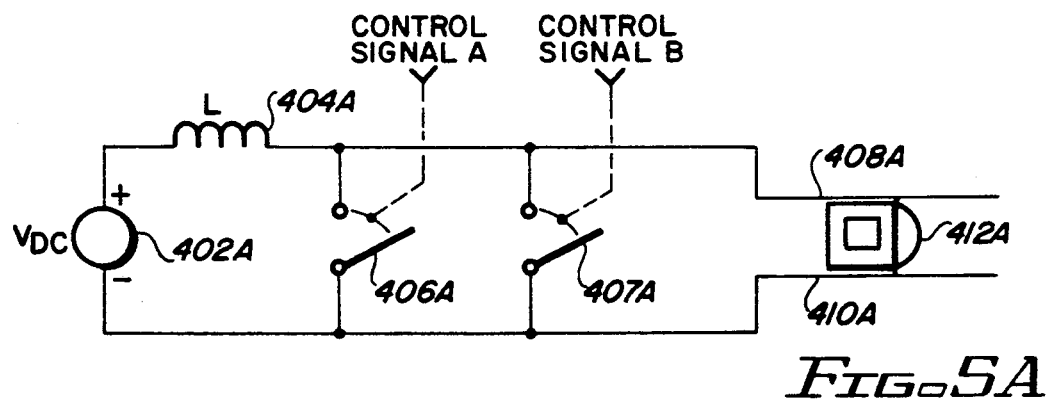
FIGS. 5A and 5B are simplified schematic diagrams showing railgun power supply systems which employ two switching devices.
Figure 5B:
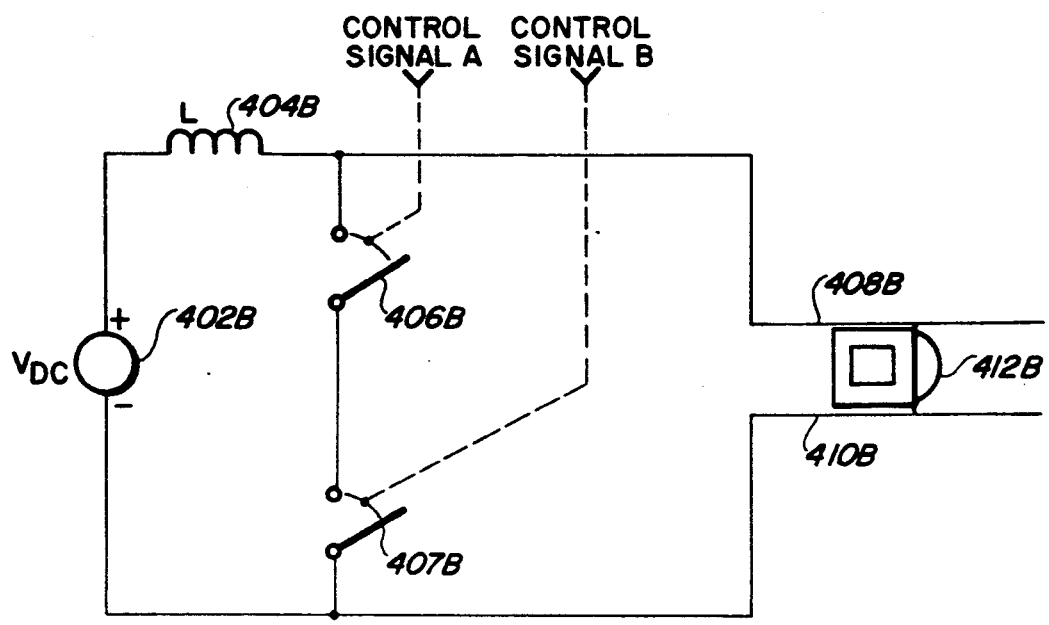

FIGS. 5A and 5B are simplified schematic diagrams of switches that may be used for controlling power to a railgun, and are presented to help understand the operating principles of the present invention. It is assumed that switches 406A (FIG. 5A) and 406B (FIG. 5B) emulate the characteristics of a silicon-controlled rectifier to the extent that once one of these switches is closed and current is flowing, therethrough, such switch cannot be opened. In order to open switch 406A or 406B, the current flow through the switch must approach zero.

As known in the art, silicon-controlled rectifiers are three-terminal, four-layer semiconductor devices which are capable of undergoing a large reduction in resistivity when current is injected into the gate region. Since the SCR's bistable switching action depends upon regenerative feedback, the SCR cannot be turned off while current is flowing through the device if the current is above a minimum threshold referred to as the "hold-on current". Typically, this hold-on current for power SCR's may be in the range of 0.1 to 1 ampere. The device turns on harder and harder with increases in current above the hold-on value. If current is forced to zero, a short recovery time is required for charge carriers to recombine before the SCR can again support forward voltage. This recovery time is a function of both temperature and the change in voltage per unit time (dV/dt) to be supported. Small dV/dt values of around 1 volt per microsecond can be supported immediately after current zero, but higher dV/dt's, up to the device ratings, require longer recovery times.

With reference to FIG. 5A, it is noted that switch 406A is designed to have a fairly low but nevertheless finite resistance to the flow of current, as would most practical SCR devices. However, switch 407A is designed to have an on resistance an order of magnitude lower than the on resistance of switch 406A. Further, switch 407A can be opened at any time, irrespective of current flow through the switch. Therefore, in operation switch 406A is first closed, and switch 407A remains open. Hence, the current travels through switch 406A, and switch 406A may not be reopened until the current approaches zero. Switch 407A is then closed. Since switch 407A has an on-resistance an order of magnitude lower than the resistance of switch 406A, most of the current will travel through switch 407A, which is the path of least resistance. At this time, current flow through switch 406A drops off significantly, to the point where switch 406A may be opened. After switch 406A is opened, current flows from the DC voltage source 402A through switch 407A to charge up the inductor 404A. Once switch 407A is opened, current is commutated to the rails 408A, 410A. The inductor 404A discharges its stored energy and the projectile 412A is propelled along the rails 408A, 410A.

The circuit illustrated at FIG. 5B operates in a manner similar to that of FIG. 5A; however the switches 406B, 407B are wired in series, as opposed to the parallel arrangement of FIG. 5A. In the series configuration shown at FIG. 5B, the on-resistance of switch 407B relative to switch 406B is not as critical as would be the case in the arrangement of FIG. 5A. When switch 407B is opened, current flow through switch 406B ceases quite rapidly. However, switch 407B must be rated to carry the full continuous current drawn by switch 406B, whereas the analogous switch 407A of FIG. 5A need only carry the full current drawn by switch 406A for a brief time interval.

Figure 6:
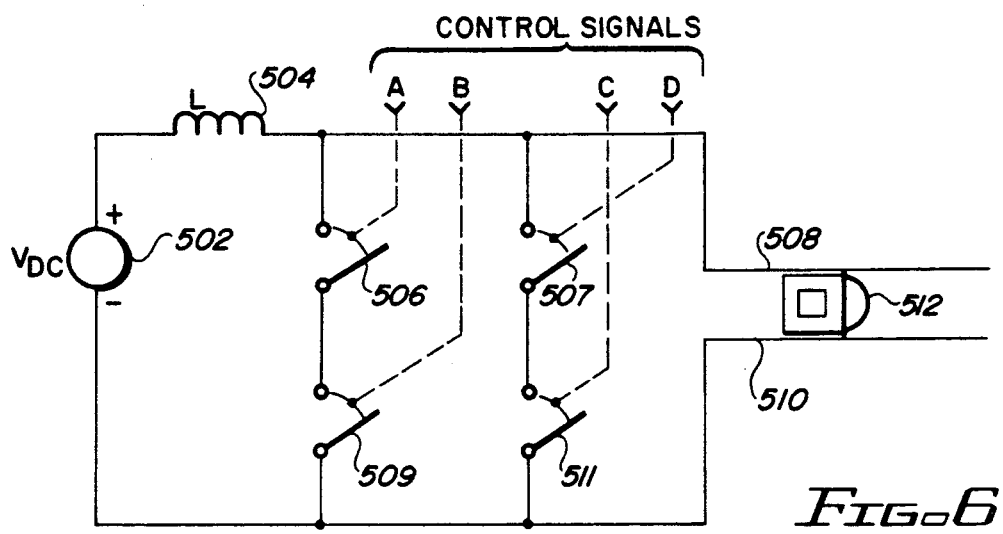
FIG. 6 is a simplified schematic diagram showing a railgun power supply system of the present invention which employs four switches.

FIG. 6 functionally illustrates a switching scheme made in accordance with one embodiment of the present invention. Each of the switches, 506, 507, 509, and 511 in FIG. 6 represent solid-state devices. Switches 506 and 511 represent silicon-controlled rectifiers that operate in a manner similar to that of switches 406A and 406B in FIGS. 5A and 5B; i.e., once current flow has been initiated, the switches 506, 511 cannot be reopened until current flow approaches zero. Furthermore, switches 507 and 509 of FIG. 6 are analogous to switches 407A and 407B of FIGS. 5A and 5B; these switches may be opened or closed at any time, irrespective of current flow through the switches. Switches 407A, 407B, 507 and 509 may be implemented using transistor-type devices.

The circuit of FIG. 6 contains a plurality of current loops. The voltage source 502 charges the inductor 504 through switches 506 and 509, or through switches 507 and 511. Current flowing in the two aforementioned branches can be cut off at any time by opening switch 509 and/or switch 507. In practice, the switching branch including switches 506 and 509 is designed for continuous steady-state operation over extended periods of time, whereas the switching branch including switches 507 and 511 is configured to operate in a pulsed mode, first accepting current transferred from the switching branch made up of switches 506 and 509 and then transferring current flow to the rails 508 and 510, and projectile 512, after the switch 506 has turned off. To transfer current from the switching branch made up of switches 506 and 509 to the switching branch made up of switches 507 and 511 switches 507 and 511 must be closed while switch 509 is opened. The opening of switch 509 will transfer the current to the switching branch made up of switches 507 and 511. Since the voltage produced across switch 509 during switching need only exceed the on-state voltage drop of the switches 507 and 511, the voltage rating of switch 509 can be quite low (i.e., on the order of 10 to 20 volts). Therefore, switch 509 may be implemented by using a semiconductor device that provides a relatively low on-state voltage drop. This is done to reduce thermal dissipation and to provide for efficient, reliable system operation, inasmuch as this branch is activated for proportionally longer periods of time. A high-power field-effect transistor satisfies many of the design requirements. The branch including switches 507 and 511 is activated for a very brief time interval, so good transient response becomes an important design factor. The semiconductor device employed for switch 511 should be rated to provide sufficient commutation voltage to transfer current from the switching branch containing switches 507 and 511 to the rails 508 and 510, and the projectile 512. Since the commutation voltage is on the order of 500 volts a high voltage switching device which can accept large momentary surge currents should be employed. An insulated gate bipolar transistor satisfies many of the requirements for switch 511.

Figure 7A:
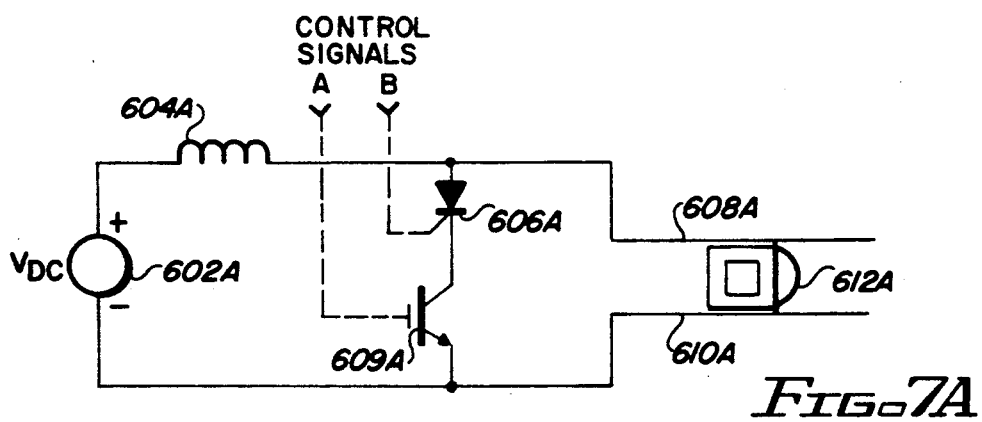
FIGS. 7A and 7B are schematic diagrams depicting solid-state switches of the present invention which employ silicon-controlled rectifiers and transistors.

FIG. 7A is a schematic diagram showing one embodiment for the switching scheme of the present invention. An SCR 606A is analogous to switch 406B (FIG. 5B), and an insulated gate bipolar transistor 609A emulates switch 407B (FIG. 5B). The operation of the switching system of FIG. 7A is a practical embodiment of the system conceptually illustrated in FIG. 5B.

The switch of FIG. 7A offers several advantages over the systems illustrated in FIGS. 2A, 2B, 3A, and 3B. A 5000-V SCR may be employed as SCR 606A to provide adequate voltage standoff for railgun applications. As the projectile 612A traverses the rails 608A, 610A, the projectile 612A generates back EMF which increases over time. Immediately after the current is transferred to the rails 608A, 610A, the back EMF generated by the projectile 612A is negligible. However, as the back EMF increases over time, the voltage on the rails 608A, 610A will approach a maximum value of 5000 volts. Fortunately, when the back EMF approaches the 5000 volt range, the SCR 606A has had sufficient time to recover, and can fully withstand a voltage potential of 5000 volts.

In addition to providing the advantage of high standoff current, the circuit of FIG. 7A implements current commutation without the need for a discrete commutation capacitor. The series arrangement forces the SCR 606A and the IGBT 609A to share current. The circuit is relatively simple; inexpensive components are used, and the parts count is low. The voltage drop across the switching components 606A and 609A is sufficiently low for many applications.

Figure 7B:
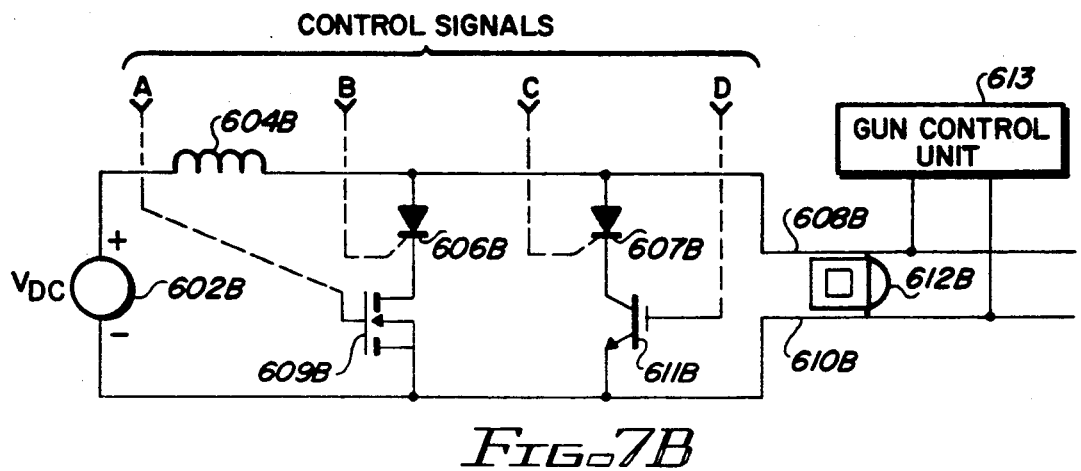

In cases where the voltage drop across the SCR/IGBT 606A, 609A combination is too high, an alternate embodiment of the invention may be employed, as shown in FIG. 7B. Two SCR's, 606B, 607B, an FET 609B, and an IGBT 611B are used. A first SCR 606B is connected in series with the (low voltage) FET 609B, and a second SCR 607B is connected in series with the (high voltage) IGBT 611B. The SCR 606B/FET 609B combination is then connected in parallel with the SCR 607B/IGBT 611B combination. The resulting switching system operates in a manner similar to that of the system described with reference to FIG. 6. Switch 506 (FIG. 6) corresponds to SCR 606B (FIG. 7B); switch 509 (FIG. 6) is analogous to switch 609B (FIG. 7B); switch 511 (FIG. 6) is analogous to switch 611B (FIG. 7B); and switch 507 (FIG. 6) corresponds to switch 607B (FIG. 7B).

The circuit topology of FIG. 7B may be referred to as a SCR/FET, SCR/IGBT dual hybrid switch. The switch employs two different switch stages (i.e., 607B/611B and 606B/609B), and uses three different types of semiconductor devices. These switching stages may be termed the charging switch stage (606B and 609B), and the commutation switch stage (607B and 611B). The charging switch stage is closed first, causing SCR 606B and FET 609B to close, thereby initially energizing the railgun power supply system. Current flowing through the SCR 606B/FET 609B combination charges an energy storage inductor 604B. A voltage drop of less than 2 volts at a current of 250 kilo-amperes may be accommodated in such a low-loss switch consisting of SCR 606B in series with FET 609B. Such charging switch is not required to transfer current to the rails 608B, 610B. Rather, a smaller switch, consisting of an SCR 607B/IGBT 611B combination and functioning on the basis of short-time pulse operation, accomplishes the desired current transfer. That is, when it is desired to commutate current to the rails 608B, 610B, the switch comprising the SCR 607B/IGBT 611B combination is closed. A well-designed railgun may require current commutation to be completed in less than 75 microseconds. Therefore, a forced commutation voltage of about 400 volts is required, and a 1000 volt IGBT module array may be employed for IGBT 611B. As mentioned previously, there is a requirement that the switch be capable of withstanding 5000 volts as the projectile 612B traverses the rails. This requirement is met by employing 5000-volt SCR's at 606B and 607B.

Figure 7C:
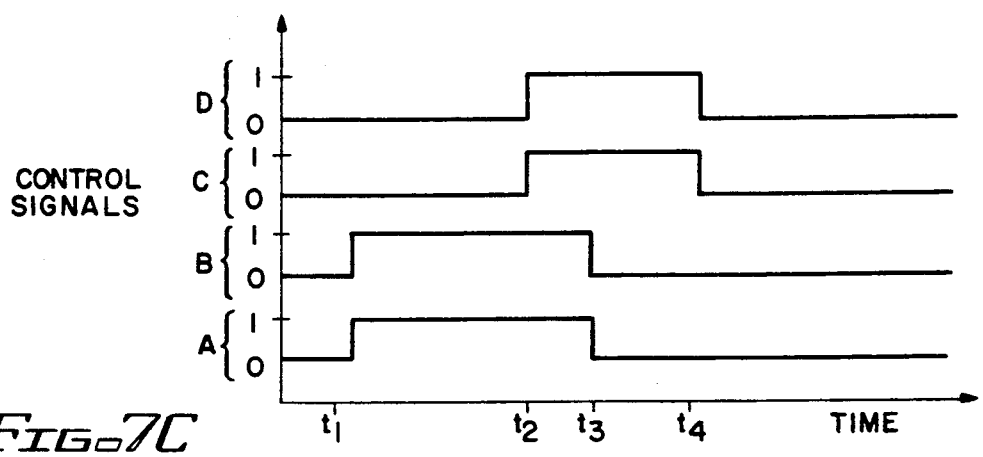
FIGS. 7C is a timing waveform diagram illustrating a typical sequence of the control signals A, B, C, D used with the switch of FIG. 7B.

The operation of the switch shown in FIG. 7B is best illustrated with reference to the timing diagram of FIG. 7C. SCR 606B and FET 609B are the charge switches. Initially, the SCR 606B/FET 609B combination is required to hold a voltage approximately equal to the voltage output of voltage source 602B, which is typically a 100-volt battery. To initiate the charge cycle at time $t_1$, appropriate control signals are provided at A and B to turn on the SCR 606B and the FET 609B. When the desired amount of energy is stored in inductor 604B, the current supplied by voltage source 602B approaches a predetermined reference value. At this time, denoted by $t_2$, control signals are provided at C and D to trigger or turn on SCR 607B and IGBT 611B. Meanwhile, at time $t_3$, a control signal is provided at B to increase the resistance of FET 609B until a 30-volt drop appears across the FET 609B. The 30-volt drop causes current to transfer out of SCR 606B and into the SCR 607B/IGBT 611B combination at a rate governed by the self-inductance of the SCR 606B/FET 609B, SCR 607B/IGBT 611B circuit.

After approximately 50 microseconds, the current in SCR 606B/FET 609B drops to zero. At this time, SCR 606B starts to recover its voltage-holding capability, i.e., it is able to turn off. Recovery time for SCR 606B is typically about 250 microseconds. After SCR 607B/IGBT 611B have been conducting current for about 300 microseconds, giving SCR 606B sufficient time to recover, at time $t_4$, a control signal is provided at D, instructing the IGBT 611B array to turn off, and opening the SCR 607B/IGBT 611B switch. The control signal at the gate of the IGBT 611B causes an 800-volt drop to occur across the IGBT 611B. The 800-volt drop transfers 250 kilo-amperes of current into a 100 nano-Henry inductor, 604B, over a time period of 62.5 microseconds.

After the SCR 607B/IGBT 611B switch has been opened, the voltage across the switch falls to a level determined by the instantaneous voltage at the breech of the railgun 612B. As a practical matter, this voltage is typically much less than the 1000 volt rating of IGBT 611B. The SCR 607B recovers fully in the interval between the opening of the IGBT 611B switch and the point in time where the voltage at the breech exceeds 1000 volts. For the present application, recovery time of the SCR chosen for SCR 607B is less than 100 microseconds. After both SCR's 606B and 607B have recovered, the switching system is ready to support the acceleration phase and the rising voltage at the breech of the railgun projectile 612B as the railgun projectile 612B traverses the rails 608B, 610B. Immediately before the projectile reaches the muzzle, control signals are provided at A and B to close the switch comprised of SCR 606B and FET 609B.

The circuit of FIG. 7B may be referred to as a cascode configuration because a transistor (FET 609B) is connected in series with the cathode of an SCR 606B. This arrangement is advantageous because the transistor controls the process of transferring current from among the various circuit branches, and provides a measure of current sharing among the various solid-state switching components. Furthermore, the SCR protects the transistor from the high voltages impressed across the SCR 606B/FET 609B switch later in the shot.

Control signals A and/or D are used to force a large voltage drop across the respective solid-state switching devices. This large voltage drop causes current to transfer from the respective solid-state device to an alternate path offering less resistance. For example, if the SCR 606B/FET 609B combination initially conducts current, FET 609B is next driven into a high-output-impedance state by the presence of an appropriate control signal at A. As a practical matter, FET 609B will now have a 30 volt conduction drop. When the switch formed by the combination of SCR 607B/IGBT 611B is turned on, the current redistributes to the path of least resistance. Since the switch formed from SCR 607B/IGBT 611B has an on-state voltage drop of around 4.9 volts at full current, the current in the SCR 606B/FET 609B combination commutates to the SCR 607B/IGBT 611B combination in a time interval determined by the switching system circuit inductance.

During the commutation time, the resistance of the FET 609B changes from a fraction of a milliohm to hundreds of thousands of ohms such that a constant voltage drop of about 30 volts is maintained across the FET 609B. At the end of the current commutation, FET 609B will be fully off and IGBT 611B will be fully on. With zero current in the SCR 606B/FET 609B combination, the SCR 606B begins to recover its voltage holding capability. After the required recovery time has elapsed, 250 microseconds in this case (dictated by the SCR junction temperature and a 100 volts/$\mu$s dV/dt to be reapplied), the IGBT 611B is now ready to commutate current to the rails 608B, 610B.

Commutation to the rails is initiated by a signal from a gun control unit 613 which is monitoring the projectile 612B. If a commutation signal is not received within a nominal time interval, the SCR 607B/IGBT 611B combination will wait approximately 10 ms for a late commutation signal. If at the end of 10 ms a commutation signal is still not received, the SCR 606B/FET 609B combination will turn back on to prevent the SCR 607B/IGBT 611B combination from overheating. If a projectile is in the gun and receives a control signal at D, a 800 volt drop appears across the IGBT array comprising IGBT 611B. This voltage forces the current out of the SCR 607B/IGBT 611B combination and into the rails 608B, 610B. The 400 volt drop across the SCR 607B/IGBT 611B initially overcomes the back EMF from the injection velocity, the arc drop, and the conduction drop of the projectile 612B along the rails 608B, 610B. The current is thus transferred into the load in <75 microseconds.

After commutation, zero current flows through the IGBT 611B/SCR 607B combination, and a back EMF of approximately 150 volts appears across the IGBT 611B/SCR 607B. This 150 volts begins to rise with a dV/dt of approximately 1 volt/$\mu$s up to 5000 volts. The SCR chosen for SCR 607B has a voltage holding recovery time of 100 microseconds and, therefore, has recovered long before the rail voltage exceeds the 1000 volt rating of the IGBT module used for IGBT 611B.

Both SCR's 607B, 606B remain open until the gun controller signals for reclosure. At this point the SCR 606B/FET 609B combination is reclosed to recharge for the next shot.

The solid-state devices used in FIG. 7B operate well within their respective safe operating area (SOA), as defined by the manufacturers of such devices. The limits of the SOA are defined in terms of loci for safe voltages, currents, and times. In the present application, the 50 to 61 microsecond current commutation times represent the time duration for which both high voltages and high currents exist across the solid-state devices. Due to the brief time interval involved, the solid-state devices suffer minimal heating, and are well within the limits of the SOA. For example, during commutation, FET 609B dissipates 375 Joules of energy. A 50-volt FET may be used for FET 609B. IGBT 611B dissipates 6200 Joules per commutation; a 500-volt IGBT may thus be employed in the present application. If the railgun is activated at a rate of ten times per second (10 hertz), the FET 609B thus dissipates 3750 watts of thermal energy and the IGBT 611B dissipates 62000 watts. 10 hertz represents the maximum repetition rate required for the railgun system.

Figure 8:
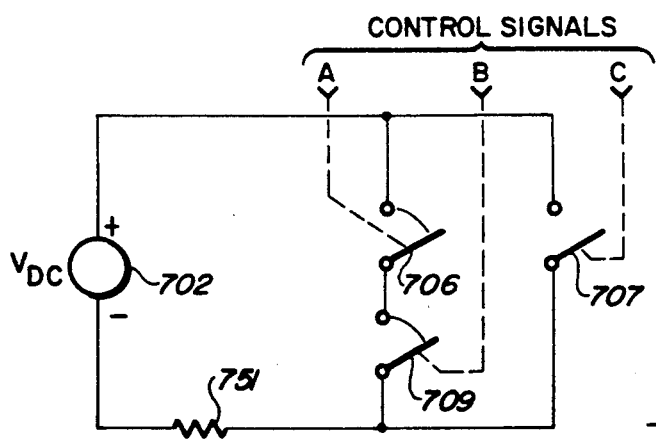
FIG. 8 is a simplified schematic diagram of a solid-state switching system designed in accordance with one embodiment of the present invention.
Figure 9A:
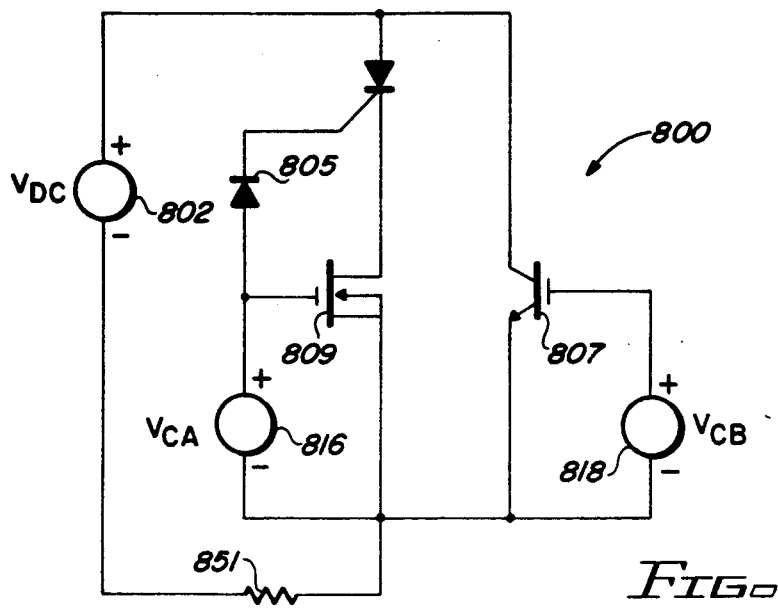
FIG. 9A is a schematic diagram showing a practical solid-state switching circuit (referred to herein as a Bi-MOS thyristor) for controlling power delivered to a load device, and designed in accordance with FIG. 8.

FIG. 8 is a simplified schematic diagram illustrating the general circuit topology of an alternative embodiment of a solid-state switch made in accordance with the present invention. FIG. 9A is a more detailed schematic diagram of such a solid-state switch. Voltage source 802 and load device 851 (FIG. 9A) are analogous to corresponding components 702 and 751 of FIG. 8. Thyristor 806 (FIG. 9A) is represented by switch 706 (FIG. 8); FET 809 (FIG. 9A) corresponds to switch 709 (FIG. 8); and IGBT 807 (FIG. 9A) is analogous to switch 707 (FIG. 8). Control signals A and B (FIG. 8) are provided by voltage source $V_{CA}$ 816 in FIG. 9A, and control signal C (FIG. 8) is provided by voltage source $V_{CB}$ 818 (FIG. 9A).

The solid-state switching circuit of FIG. 9A controls the current delivered to a load resistance 851. The circuit is designed to deliver current in the range of 250 to 1000 amperes, for use in applications such as high-power spacecraft power distribution systems. The switch of FIG. 9A combines two discrete MOS devices: field-effect transistor (FET) 809, and insulated-gate bipolar transistor (IGBT) 807. The FET 809 and the IGBT 807 are used to control a low-loss thyristor 806. This technique is similar to the principles of MCT operation illustrated in FIG. 4 where an FET 1106 turns off a thyristor 1102, 1104. Thyristors such as SCR 806 (FIG. 9A) exhibit much lower losses and much higher current densities than discrete transistors, but thyristors do not turn off because they have a regenerative gating scheme whereby positive feedback continuously increases the gate drive as more current flows through the device.

The circuit of FIG. 9A provides the advantage of having a turn-off switch with the superior conduction qualities of a thyristor. The circuit represents a device which may be termed a "Bi-MOS thyristor" 800. The Bi-MOS thyristor 800 forces the turn-off and recovery of thyristor 806 by means of two discrete MOS devices, FET 809 and IGBT 807, in a manner analogous to the operation of FET's 1106 and 1108 in FIG. 4. However, the Bi-MOS thyristor 800 can switch substantially higher power levels than the MCT 1100 (FIG. 4). Furthermore, the Bi-MOS thyristor 800 can be cooled from two sides and it blocks full reverse voltages. These features are not provided by MCT 1100 devices.

Thyristor 806 can be selected on the basis of lowest loss, or, alternatively, on the basis of high speed. A typical 1000-amp Bi-MOS thyristor 800 design has an on-state voltage drop of less than 1.2 volts, a blocking voltage of 1000 volts, a commutation time of 100 microseconds, a mass of less than 1.5 kilograms, and a volume of less than $460 \times 10^{-6}$ cubic meters. If a high-speed SCR is selected for thyristor 806, commutation time is less than 15 microseconds, and on-state voltage drop is less than 1.4 volts.

The Bi-MOS thyristor 800 shown in FIG. 9A may be used to switch power from a DC voltage source 802 to a load device 851. The Bi-MOS thyristor 800 is comprised of three devices arranged in two current paths. The thyristor 806 and the FET 809 form the continuous-conduction portion of the circuit. As seen in FIG. 9A, the thyristor 806 and the FET 809 are connected in series; in a cascode configuration. The IGBT 807 is connected in parallel with the 806/809 cascode configuration, and provides the momentary-conduction (pulse) portion of the circuit, conducting current only during the turn-off time.

Figure 9B:
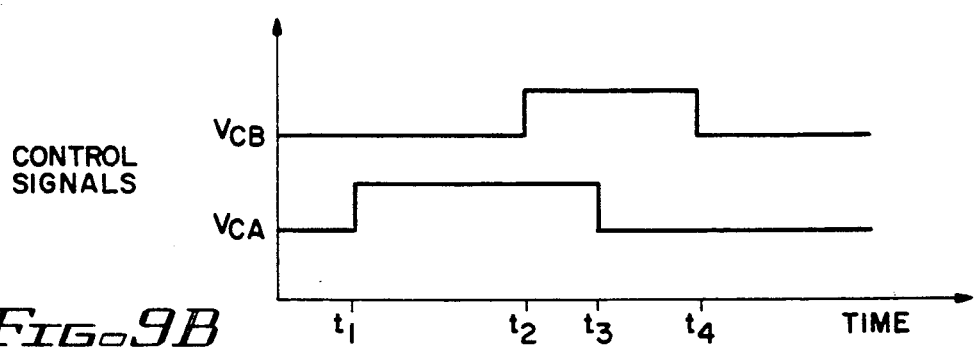
FIG. 9B is a timing waveform diagram illustrating the operation of the switching circuit of FIG. 9A.

The operation of the circuit in FIG. 9A may be further understood by referring to the timing diagram of FIG. 9B. In the conduction state, the thyristor 806 and the FET 809 are gated "on" via voltage source $V_{CA}$ 816 at time $t_1$. Thus, when "on", both the FET 809 and the thyristor 806 are conducting current. A diode 805 prevents thyristor 806 gate current from flowing through voltage source $V_{CA}$ 816 when the voltage output of $V_{CA}$ is reduced to zero volts, at time $t_3$. When it is desired to turn the Bi-MOS thyristor switch 800 off, the IGBT 807 is gated on via voltage source $V_{CB}$ 818 at time $t_2$. Thereafter, the cascode FET 809 is turned off by adjusting $V_{CA}$ 816 to the appropriate voltage level at $t_3$, e.g., zero volts as biased in FIG. 9A. The current transfers to the IGBT 807 as soon as the FET 809 terminal voltage increases above the on-state conduction drop of the IGBT 807, or approximately 5 volts. However, in order to compensate for the IGBT 807 voltage drop and the stray circuit inductance between the IGBT 807 and the FET 809, this FET 809 terminal voltage should be increased well above 5 volts, e.g., up to 25 volts. After the FET 809 is turned off, all current is transferred to the IGBT 807, and there is no current in the FET 809/thyristor 806 current path. At this time, the thyristor 806 starts to recover its voltage-holding capability.

The lowest-loss thyristors which are presently available require approximately 100 microseconds of zero current for the charge carriers to recombine and for voltage-holding capability to recover. High-frequency thyristors (above 5 kilohertz) require about 10 microseconds to recover, but an additional on-state voltage drop of approximately 0.3 volts must be tolerated. The IGBT 807 conducts current during the thyristor 806 recovery time, and when recovery is achieved, the IGBT 807 is turned off via voltage source $V_{CB}$ 818 at $t_4$ to stop current flow altogether.

An advantage of the switch of FIG. 9A is that the required semiconductor devices are small and lightweight relative to the amount of power handling capability offered. The IGBT 807 is pulse-rated and only conducts current for about 100 microseconds. Accordingly, the IGBT 807 may be safely operated at ten times its continuous current rating in the circuit of FIG. 9A. The FET 809 is a relatively small device, since FET's with a low blocking voltage are available at high current densities. The entire Bi-MOS thyristor 800 is about one-half the size of a similarly-rated IGBT switch, or about one-third the size of a similarly-rated FET switch.

Due to the fact that the Bi-MOS thyristor 800 is frequently the highest-powered solid-state device employed in electronic systems, the power density and the efficiency of the switch is a critical parameter in determining the overall system figure of merit. Currently available high-power solid-state switching devices have a mass-power density of no more than 80 kilowatts per kilogram and a voltage drop of at least 2.5 volts. The Bi-MOS thyristor of FIG. 9A improves upon these figures by a factor of two, and offers a threefold improvement in volumetric power density. A switched volumetric power density in excess of 600 watts per cubic centimeter is provided, along with a mass power density of greater than 180 kilowatts per kilogram.

In addition to power density, efficiency is an important design criterion because high-current solid-state switches typically have high heat-rejection power densities of about 20 to 50 watts per square centimeter, and are quite difficult to cool. The energy lost in the form of thermal dissipation, due to on-site voltage drop, places a significant burden on the thermal management of such systems in environments such as aircraft or space vehicles. The size and mass of the system must often be increased to ensure adequate thermal dissipation. Since the on-state voltage drop of the Bi-MOS thyristor switch of FIG. 9A is less than 1.2 volts at full current, thermal dissipation is significantly less than for similarly-rated prior-art devices which are, at best, able to provide a 2.5 volt drop.

Figure 9C:
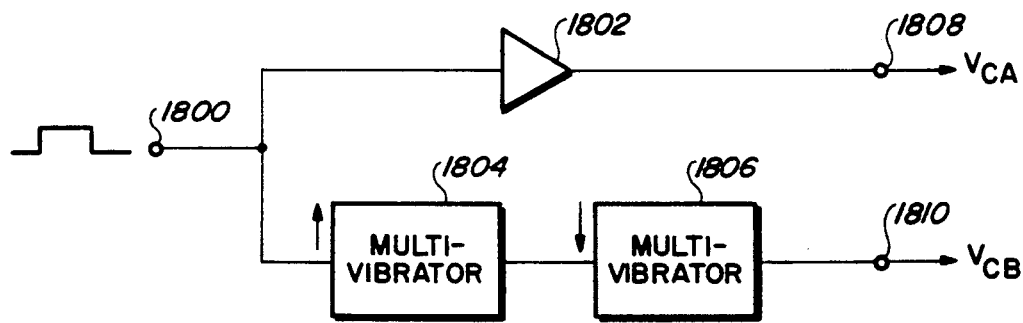
FIG. 9C is a block diagram of a representative control circuit that may be used to control the switch of FIG. 9A and generate the signals of FIG. 9B.

FIG. 9C is a block diagram of a representative control circuit that may be used to control the switch of FIG. 9A and generate the control signals of FIG. 9B. A pulse is fed to input terminal 1800. The pulse is processed by a buffer amplifier 1802 to produce control signal $V_{CA}$ at output terminal 1808. The input signal at 1800 is also fed to two one-shot multivibrator circuits arranged in series, 1804 and 1806. These circuits 1804, 1806 function as a delay line. The output 1810 of multivibrator 1806 may be used as a source for control signal $V_{CB}$.

Figure 10:
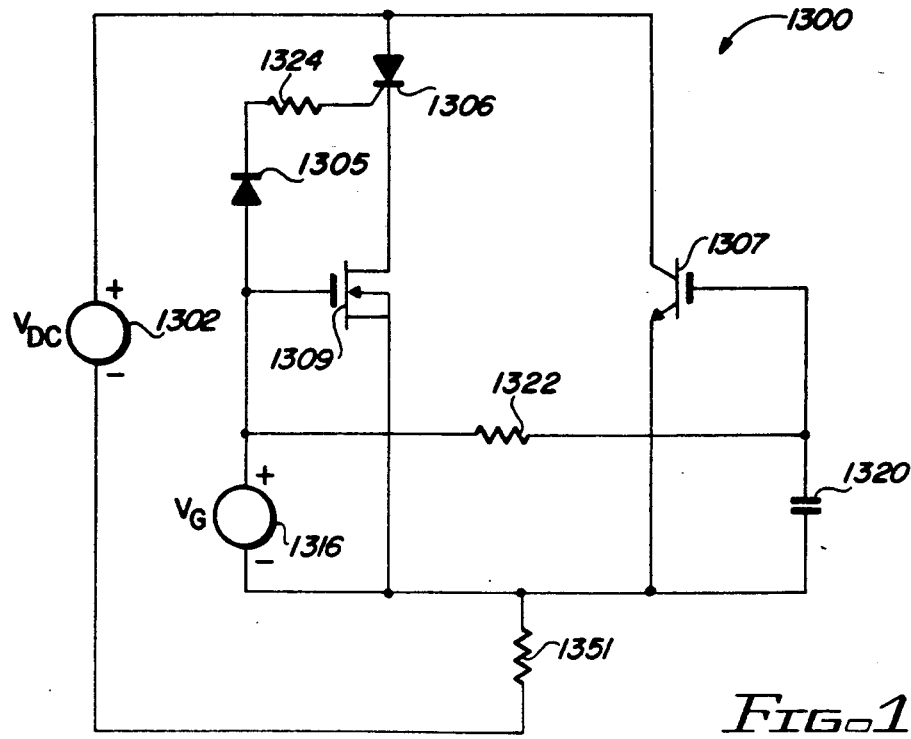
FIG. 10 is a schematic diagram of the Bi-MOS thyristor shown in FIG. 9A with the incorporation of additional control signal generation circuitry.

FIG. 10 is a schematic diagram of the Bi-MOS thyristor shown in FIG. 9A with additional components incorporated into the circuit. These additional components process one input gating signal to produce the three control signals A, B, and C (FIG. 8) required to operate the Bi-MOS thyristor 800 (FIG. 9A). Voltage source $V_G$ 1316 (FIG. 10) represents an input gating signal that increases from a low-level voltage to a high-level voltage. This signal is fed directly to the gate of FET 1309, providing a control signal corresponding to signal B (FIG. 8). The voltage source $V_G$ 1316 is also connected to the gate of a thyristor 1306 through a diode 1305 and a resistor 1324. The diode 1305 and the resistor 1324 provide protection against reverse currents, and ensure that the gate of thyristor 1306 will operate without changing the bias at the gate of FET 1309. The voltage source $V_G$ 1316 is also connected to the gate of IGBT 1307 through an R-C delay network consisting of a series resistance 1322 and a parallel capacitance 1320. Thus, the IGBT 1307 will not be triggered until the FET 1309 terminal voltage increases above the on-state conduction drop of the IGBT 1307, or approximately 5 volts.

Figure 11:
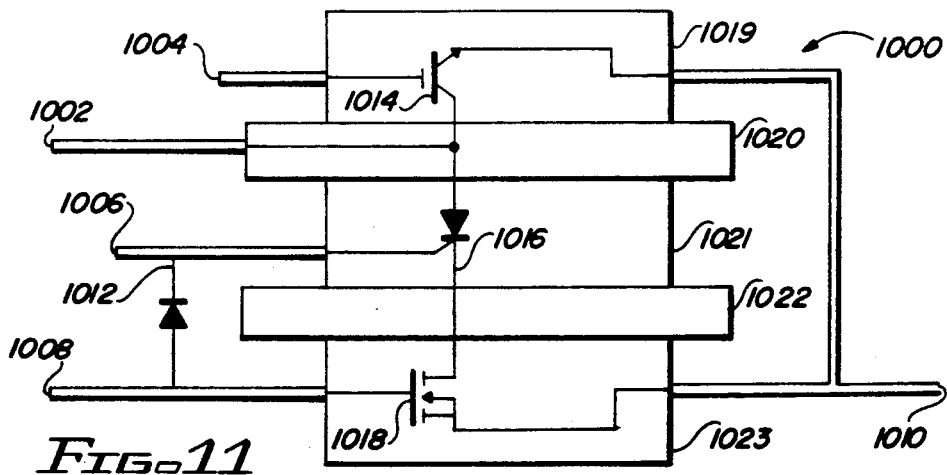
FIG. 11 is a pictorial representation and partial schematic diagram of a switch constructed in accordance with FIG. 8.

FIG. 11 illustrates a preferred physical layout for Bi-MOS thyristor switch 1000 made in accordance with the teachings of FIGS. 9A or 10. The arrangement permits the device 1000 to be cooled from two sides, top and bottom, thus facilitating thermal transfer. Terminal 1002 is the input of the Bi-MOS thyristor switch 1000, terminal 1010 is the output, terminal 1004 is the IGBT gate terminal, and terminal 1008 is the FET gate terminal. A voltage source, shown as $V_{CA}$ 816 (FIG. 9A) or $V_G$ 1316 (FIG. 10) may be connected between terminals 1008 (FIG. 11) and 1010 (FIG. 11). Another voltage source, shown as $V_{CB}$ 818 (FIG. 9A) may be connected between terminals 1004 (FIG. 11) and 1010 (FIG. 11), or, alternatively, a capacitor, shown as capacitor 1320 (FIG. 10), may be connected between terminals 1004 (FIG. 11) and 1010 (FIG. 11) and a resistor shown as resistor 1322 (FIG. 10), may be connected between terminals 1004 (FIG. 11) and 1008 (FIG. 11) which together with Va 1316 (FIG. 10), connected as described above, form an RC-delayed voltage source. Voltage source $V_{DC}$ 802 (FIG. 9A), 1302 (FIG. 10) is connected between input terminal 1004 (FIG. 11) and a first terminal of a load device 851 (FIG. 9A), 1351 (FIG. 10). A second terminal of the load device 851 (FIG. 9A), 1351 (FIG. 10) is connected to output terminal 1010 (FIG. 11). A diode 1012 (FIG. 11) may be placed across terminals 1006 (FIG. 11) and 1008 (FIG. 11). This diode 1012 (FIG. 11) corresponds to diode 805 (FIG. 9A), 1395 (FIG. 10). The uppermost layer 1019 (FIG. 11) of the Bi-MOS thyristor switch contains an IGBT 1014 (FIG. 11), 807 (FIG. 9A), 1307 (FIG. 10). Layer 1020 (FIG. 11) may contain cooling means such as tubing for the passage of a liquid or gaseous coolant. Layer 1021 (FIG. II) contains a thyristor 1016 (FIG. 11) corresponding to thyristor 806 (FIG. 9A), 1306 (FIG. 10). Layer 1022 (FIG. 11) may contain cooling means similar to the means present in layer 1020 (FIG. 11). The lowest layer, layer 1023 (FIG. 11), contains a field-effect transistor 1018 (FIG. 11) corresponding to FET 809 (FIG. 9A), 1309 (FIG. 10).

Although the Bi-MOS thyristor switch 1000 of FIG. 11 permits two-sided cooling, it is possible to design a similar switch for one-sided cooling. For one-sided cooling, the three active semiconductor components (FET 809, IGBT 807, and thyristor 806, FIG. 9A; FET 1309, IGBT 1307, and thyristor 1306, FIG. 10) are vacuum-brazed to a beryllium oxide substrate similar to the substrate used for IGBT 807 (FIG. 9A), 1307 (FIG. 10). The copper substrate can either be electrically isolated or used as an electrical terminal, depending upon the specific application desired. However, single-sided cooling yields lower power density than the two-sided counterpart presented in FIG. 11. Advantageously, the Bi-MOS thyristor switch 1000 of FIG. 11 provides the highest power density and lowest loss of any high-power solid-state switch currently known to applicant.

Figure 12:
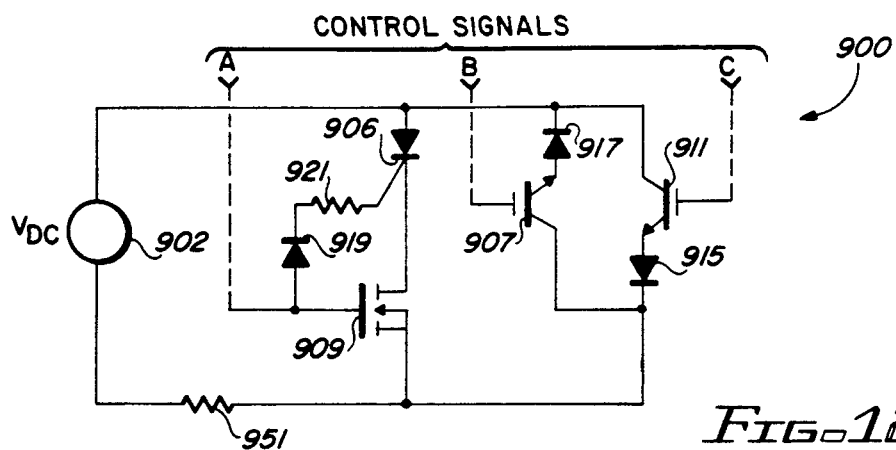
FIG. 12 is a schematic diagram showing an alternate embodiment of a switching device designed in accordance with FIG. 9A.

FIG. 12 is a schematic diagram of a bidirectional Bi-MOS thyristor 900. The bidirectional Bi-MOS thyristor 900 may be employed in DC systems where brief periods of reverse current must be tolerated.

Basically, an additional IGBT 907 has been added to the circuit of FIG. 9A placed antiparallel to the pulse IGBT (807, FIG. 9A; 911, FIG. 12). In this manner, bidirectional current flow capability is provided. Diodes 915, 917 have been incorporated into the circuit of FIG. 12 to offer the capability of forward and reverse current blocking. The remaining components of FIG. 12 correspond to the respective components of FIG. 9A; i.e., load device 851 in FIG. 9A is load device 951 in FIG. 12, etc.

Figure 13:
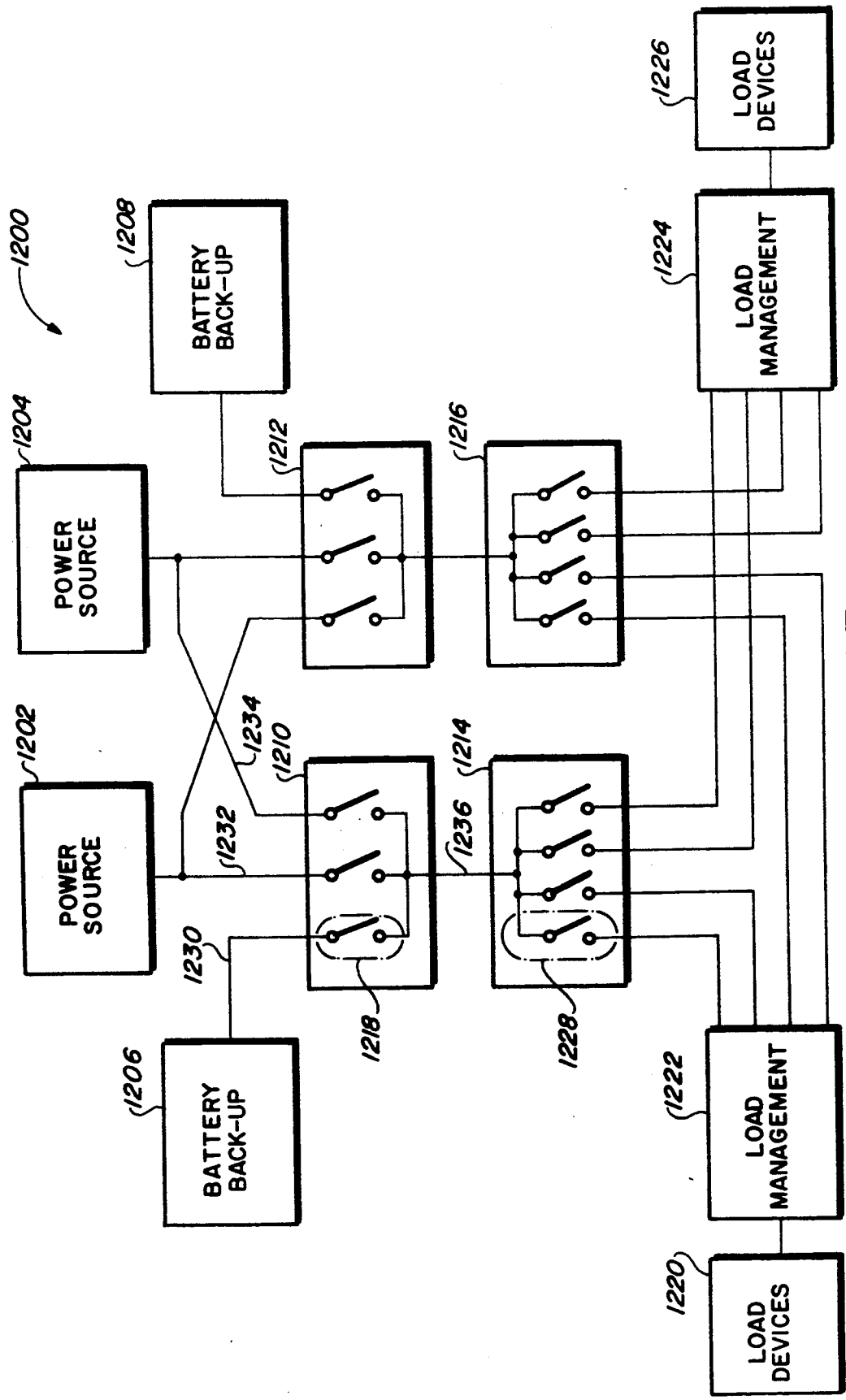
FIG. 13 is a block diagram showing a DC solid-state power controller which employs the thyristor devices of FIG. 8.

FIG. 13 shows a block diagram illustrating one possible use of the Bi-MOS thyristor switch of the present invention in a solid-state power controller 1200. The system includes two DC power sources 1202, 1204, backup batteries 1206, 1208, load transfer units 1210, 1212, power distribution units 1214, 1216, load management centers 1222, 1224 and load devices 1220, 1226. The load transfer units 1210, 1212 and the power distribution units 1214, 1216 each contain one or more solid-state switches 1218, 1228. The Bi-MOS thyristor switch 800 (FIG. 9A) may be used for any of the switches shown in FIG. 12, including switch 1218 and/or switch 1228. The load transfer unit 1210 contains three input buses 1230, 1232, 1234. These input buses receive power from power sources 1202, 1204, or battery back-up 1206. The load transfer unit 1210 selects one of the three power inputs 1230, 1232, 1234, and connects the selected input line to an output bus 1236. Output bus 1236 is connected to the input of a power distribution unit 1214. The power distribution unit 1214 connects the bus 1236 to one or more load management centers 1222, 1224. In turn, the load management centers drive various load devices 1220, 1226. Power distribution systems similar to that shown in FIG. 13 are employed in aircraft and space vehicles.

Figure 14:
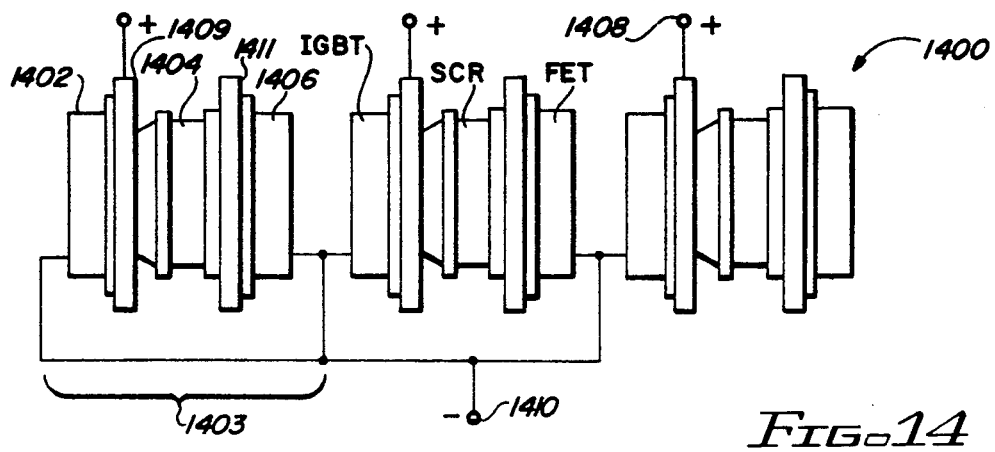
FIG. 14 is a pictorial representation of a 1000-amp Bi-MOS thyristor array in a multiple-device package.

FIG. 14 is a pictorial representation of a 1000-amp Bi-MOS thyristor 1400 fabricated in a multiple-device package. Each Bi-MOS device 1403 is similar to the Bi-MOS thyristor illustrated in FIG. 11. Bi-MOS device 1403 contains an IGBT 1402, an SCR 1404, and an FET 1406. Cooling fins 1409, 1411 may contain hollow tubing for the passage of liquid or gaseous coolant material. The negative terminals of the individual Bi-MOS devices 1403 may be connected together to form a common terminal 1410. Each Bi-MOS device provides a positive terminal 1408 which need not be joined to the corresponding terminals on other Bi-MOS devices 1403. The manner in which the 1000-amp Bi-MOS thyristor 1400 is packaged offers an advantage in that the device is relatively easy to cool. Furthermore, the configuration is mechanically rugged, yet electrical terminals are easily accessible for use in a wide variety of applications.

Figure 15:
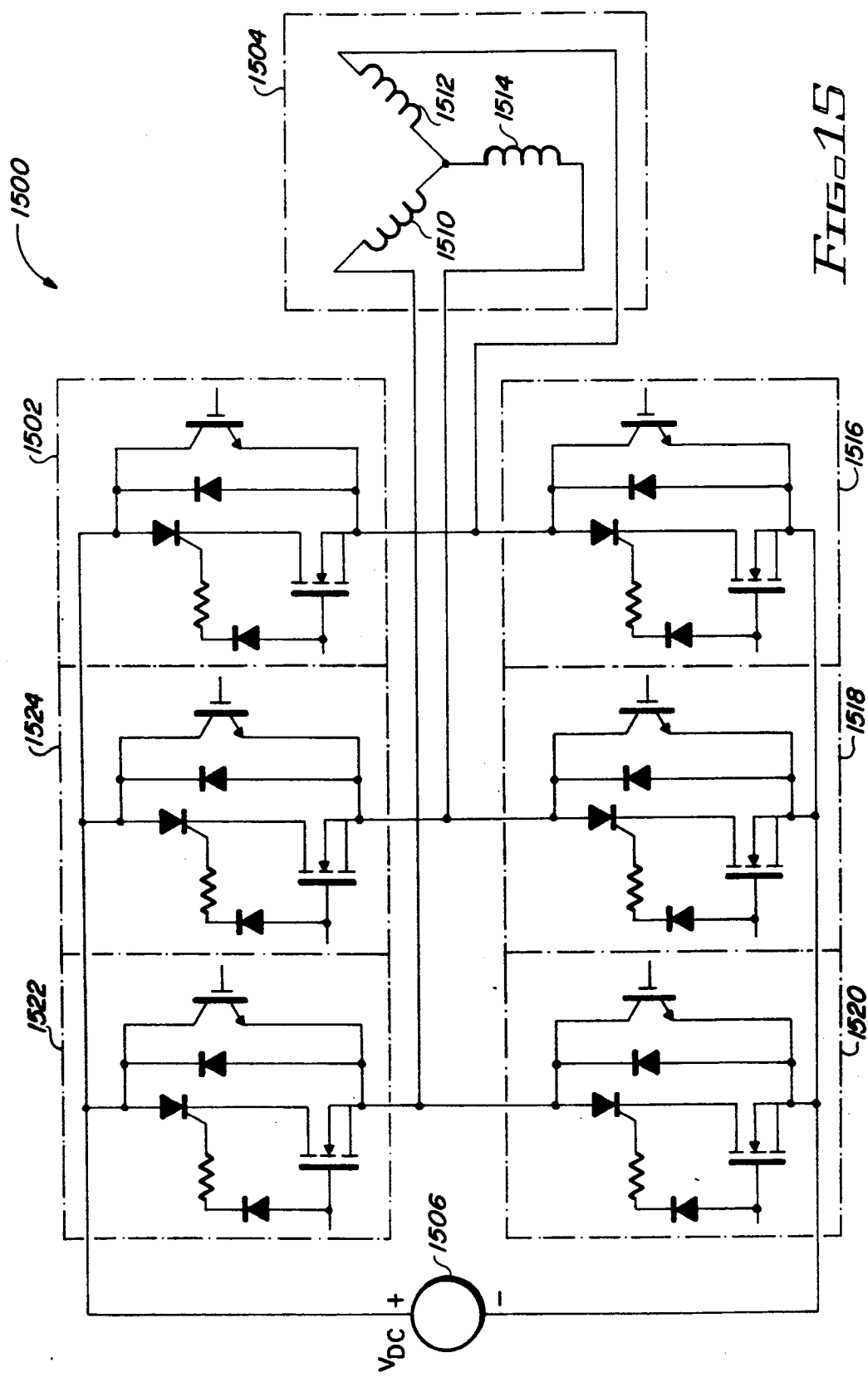
FIG. 15 is a schematic diagram of a motor drive control circuit 1500 using Bi-Mos thyristors.

FIG. 15 is a schematic diagram of a motor drive control circuit 1500 using Bi-MOS thyristor switches 1502, 1516, 1518, 1520, 1522, 1524. Each Bi-MOS thyristor switch 1502, 1516, 1518, 1520, 1522, 1524 is similar to the Bi-MOS thyristor switches 800, 1300, 1000 of FIGS. 9A, 10, or 11, respectively. Motor 1504, for example, is a 270 volts DC, 50 horsepower, 3-phase motor having three windings 1510, 1512, and 1514. Each winding 1510, 1512, 1514 is driven by a pair of Bi-MOS thyristors placed in series with a DC voltage source 1506, a 270 volt DC power supply. For example, winding 1512 is driven by Bi-MOS thyristors 1502 and 1516. The gating inputs of the Bi-MOS thyristors 1502, 1516, 1518, 1520, 1522, 1524 are fed with control signals at the appropriate time intervals to control the movement of the motor 1504 as desired.

Figure 16:
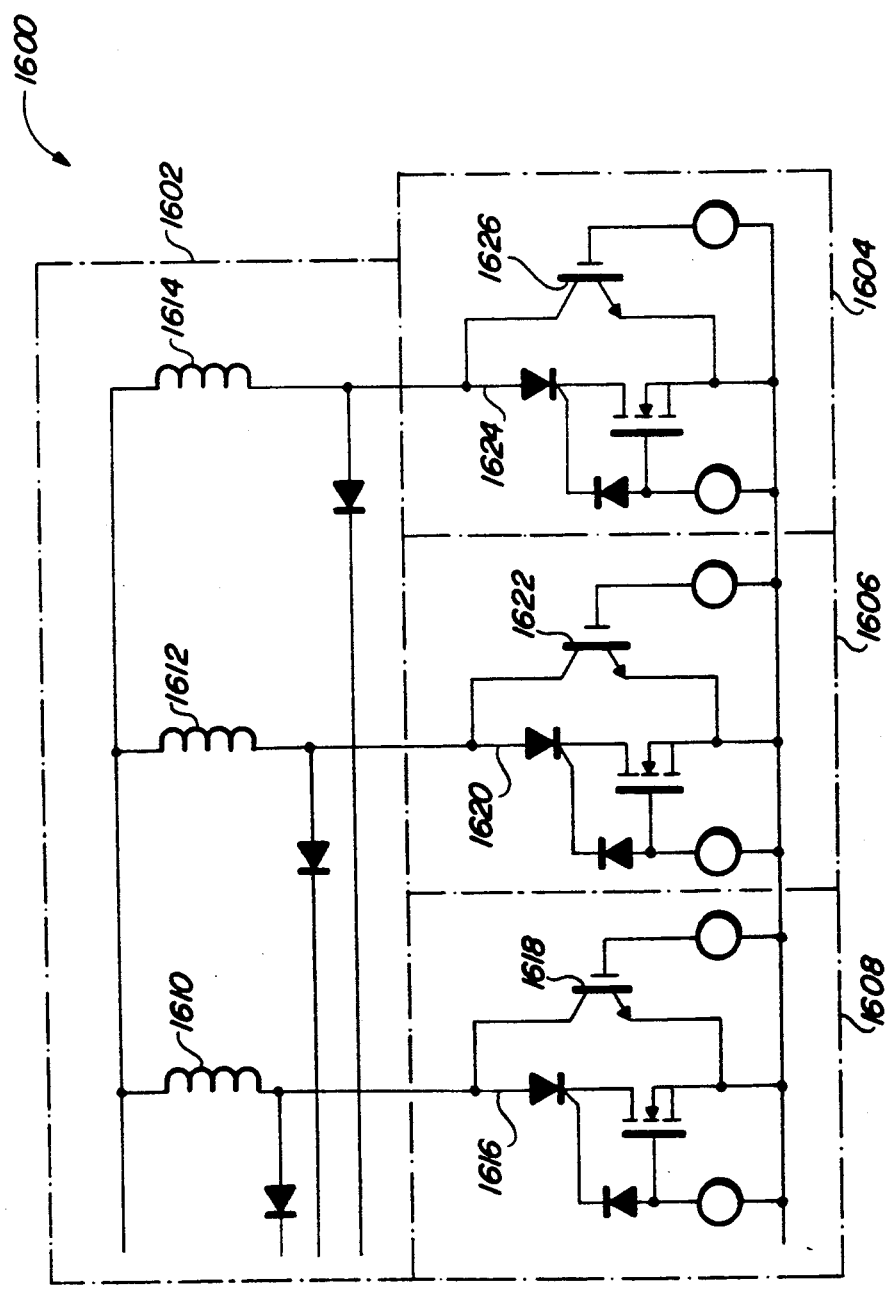
FIG. 16 is a schematic diagram of a switched reluctance motor drive circuit.

FIG. 16 is a schematic diagram of a switched reluctance motor drive 1600. Three Bi-MOS thyristor switches 1604, 1606, 1608 are used to drive the reluctance motor 1602. The reluctance motor 1602 contains three windings 1610, 1612, 1614. Individual Bi-MOS thyristor switches are used to drive each of the windings. For instance, Bi-MOS thyristor switch 1608 drives winding 1610,; Bi-MOS thyristor switch 1606 drives winding 1612.; and Bi-MOS thyristor 1604 drives winding 1614. The Bi-MOS thyristor switches 1604, 1606, and 1608 may be substantially similar to the Bi-MOS thyristor switches 800, 1300, 1000 of FIGS. 9A, 10, or 11.

The circuit of FIG. 16 provides a good match to a switched reluctance motor. The losses of the motor drive circuit 1600 are lower than losses for other types of solid-state drive circuits. In general, the use of solid-state circuitry to drive a motor will result in two types of losses: conduction losses and switching losses. Switching losses are transient in nature, whereas conduction losses involve motor operation for a continuous period of time. The circuit of FIG. 16 minimizes both types of losses because the relatively low forward voltage drops of SCR's 1616, 1620, and 1624 are used to absorb the conduction losses. Switching losses are absorbed by the IGBT's 1618, 1622, 1626, which may be selected to optimize efficiency and switching speed.

As a practical matter, motor drive circuit 1600 offers about half the loss, 2 times the power density, and ⅓ the mass of a conventional switch. Further, the safe operating area (SOA) is relatively large. High current surge capability renders the motor drive circuit 1600 equivalent to a rugged mechanical switch.

The invention has been described in detail with reference to certain particular embodiments thereof. It will be understood, however, that variations and modifications can be effected within the spirit and scope of the invention as set forth in the claims.

What is claimed is:

1. A solid-state switch for controlling a source of direct current, said switch comprising:
   first, second, third, and fourth switching elements, each of said switching elements having a first terminal, a second terminal, and a control signal input terminal;

said first switching element providing a low resistance to the flow of electrical current between said first and said second terminals in response to a first control signal input to said control signal input terminal; said first switching element providing a high resistance to the flow of electrical current between said first and said second terminals in response to a second control signal input to said control signal input terminal provided that the flow of said electrical current between said first and said second terminals is below a minimum threshold value when said second control signal is input to said control signal input terminal;

said second switching element providing a low resistance to the flow of electrical current between said first and said second terminals in response to a third control signal input to said control signal input terminal; said second switching element providing a high resistance to the flow of electrical current between said first and said second terminals in response to a fourth control signal input to said control signal input terminal;

said third switching element providing a low resistance to the flow of electrical current between said first and said second terminals in response to a fifth control signal input to said control signal input terminal; said third switching element providing a high resistance to the flow of electrical current, between said first and said second terminals in response to a sixth control signal input to said control signal input terminal provided that the flow of said electrical current between said first and said second terminals is below a minimum threshold value when said second control signal is input to said control signal input terminal;

said fourth switching element providing a low resistance to the flow of electrical current between said first and said second terminals in response to a seventh control signal input to said control signal input terminal; said fourth switching element providing a high resistance to the flow of electrical current between said first and said second terminals in response to an eighth control signal input to said control signal input terminal;

said first and said second switching elements being connected in series, and said third and fourth switching elements being connected in series, and said series combination of said first and said second switching elements being connected in parallel with the series combination of said third and said fourth switching elements.

2. A solid-state switch as set forth in claim 1 wherein said first and said third switching elements include silicon-controlled rectifiers.

3. A solid-state switch as set forth in claim 2 wherein said second switching element includes a field-effect transistor and said fourth switching element includes an insulated-gate bipolar transistor.

4. A solid-state switch as set forth in claim 1 further including current storage means for storing electrical current connected in series with said source of direct current.

5. A solid-state switch as set forth in claim 4 wherein said current storage means comprises an inductor.

6. A solid-state switch as set forth in claim 1 wherein said source of direct current generates a voltage potential of approximately 400 volts open-circuit and approximately 250 kilo-amperes short-circuit and 5000 V after current is commutated to a railgun load.

7. A solid-state switch as set forth in claim 1 wherein said first and said third switching control signals are supplied to said respective switching elements to effect a continuous mode of operation, and said fifth and said seventh control signals are supplied to said respective switching elements to effect a pulsed mode of operation.

8. A solid-state switch as set forth in claim 1 further including a load connected in parallel with said parallel series combinations of said first and second, and said third and fourth switching elements.

9. A solid-state switch as set forth in claim 8 wherein said load includes a pair of electrically conductive rails and a projectile adapted to traverse said rails in response to a voltage applied across said rails, whereby a current flows through said projectile.

10. A solid-state switch for controlling a source of direct current, said switch comprising:

a first switching element having a first terminal, a second terminal, and a control signal input terminal; said first switching element providing a low resistance to the flow of an electrical current between said first and said second terminals in response to a first control signal input to said control signal input terminal; said first switching element providing a high resistance to the flow of said electrical current between said first and said second terminals in response to a second control signal input to said control signal input terminal provided that the flow of said electrical current between said first and said second terminals is below a minimum threshold value when said second control signal is input to said control signal input terminal; said first switching element comprising a silicon-controlled rectifier;

a second switching element having a first terminal, a second terminal, and a control signal input terminal; said second switching element providing a low resistance to the flow of electrical current between said first and said second terminals in response to a third controls signal input to said control signal input terminal; said second switching element providing a high resistance to the flow of said electrical current between said first and said second terminals in response to a fourth control signal input to said control signal input terminal; said second switching element comprising a field-effect transistor; said second switching element being connected in series with said first switching element to form a first switching path;

a third switching element having a first terminal, a second terminal, and a control signal input terminal; said third switching element providing a low resistance to the flow of electrical current between said first and said second terminals in response to a fifth control signal input to said control signal input terminal; said third switching element providing a high resistance to the flow of said electrical current between said first and said second terminals in response to a sixth control signal input to said control signal input terminal; said third switching element comprising an insulated-gate bipolar transistor; said third switching element being connected in parallel with said first switching path to form a switching network.

11. A solid-state switch as set forth in claim 10 further including control signal protection means for producing said first, second, third, fourth, fifth, and sixth control signals.

12. A solid-state switch as set forth in claim 11 wherein said control signal production means includes a voltage source and at least one device selected from the group of capacitors and resistors.

13. A solid-state switch comprising first solid-state switching means for providing a low-resistance path between first and second terminals in response to a trigger signal, and for providing a high-resistance path between said first and second terminals only in the absence of said trigger signal and in the absence of any significant amount of current flowing between said first and second terminals; said first solid-state switching means comprising a silicon-controlled rectifier;

second and third solid-state switching means for selectively providing a low- or high-resistance path between respective first and second terminals thereof in response to respective control signals, and low-resistance path of said third solid-state switching means having a lower resistance than the low-resistance path of said second solid-state switching means; said second solid state switching means comprising a field-effect transistor and said third solid state switching means comprising an insulated-gate bipolar transistor;

said first solid-state switching means being connected in series with the second solid-state switching means to form a series combination, the second terminal of said first solid-state switching means being connected to the first terminal of said second solid-state switching means in said series combination;

said third solid-state switching means being connected in parallel with said series combination to form a parallel network, the first terminal of said third solid-state switching means being connected to the first terminal of said first solid-state switching means, and said second terminal of said third switching mean being connected to said second terminal of said second switching means;

a first terminal of said parallel network comprising the connection between said first terminals of said first and third solid-state switching means, and a second terminal of said parallel network comprising the connection between said second terminals of said second and third solid-state switching means; and means for generating said trigger and control signals such that a first low-resistance path between said first and second terminals of said parallel network is created through the series combination of said first and second switching means whenever it is desired to turn said solid-state switch on, and a second low-resistance path between said first and second terminals of said parallel network is momentarily created through said third switching means whenever it is desired to turn said solid-state switch off, the momentary presence of said second low-resistance path serving to provide a lower resistance path than said first resistance path, whereby the current flowing through the first resistance path is momentarily diverted to the second resistance path, so that the first solid-state switching means can provide a high-resistance path, the second low-resistance path reverting to a high-resistance path after a momentary time period.

* * * * *